(12) United States Patent
Zhong et al.

(10) Patent No.: US 11,782,318 B2
(45) Date of Patent: Oct. 10, 2023

(54) ARRAY SUBSTRATE, LIQUID CRYSTAL DISPLAY PANEL AND DISPLAY DEVICE

(71) Applicants: Beijing BOE Optoelectronics Technology Co., Ltd., Beijing (CN); BOE Technology Group Co., Ltd., Beijing (CN)

(72) Inventors: Xuan Zhong, Beijing (CN); Hongliang Yuan, Beijing (CN); Jian Wang, Beijing (CN); Qi Zheng, Beijing (CN); Jiantao Liu, Beijing (CN); Yao Bi, Beijing (CN); Hailong Wang, Beijing (CN); Lanjun Guo, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 290 days.

(21) Appl. No.: 17/280,966

(22) PCT Filed: Sep. 21, 2020

(86) PCT No.: PCT/CN2020/116497
§ 371 (c)(1),
(2) Date: Mar. 29, 2021

(87) PCT Pub. No.: WO2021/057656
PCT Pub. Date: Apr. 1, 2021

(65) Prior Publication Data
US 2022/0308409 A1 Sep. 29, 2022

(30) Foreign Application Priority Data

Sep. 26, 2019 (CN) .......................... 201910918583.9

(51) Int. Cl.
*G02F 1/1362* (2006.01)
*G02F 1/1343* (2006.01)
*H01L 27/12* (2006.01)

(52) U.S. Cl.
CPC .... *G02F 1/136213* (2013.01); *G02F 1/13439* (2013.01); *G02F 1/136227* (2013.01);
(Continued)

(58) Field of Classification Search
CPC .................................................... G02F 1/1362
See application file for complete search history.

(56) References Cited

U.S. PATENT DOCUMENTS

2001/0019372 A1 9/2001 Ootsu et al.
2002/0051107 A1* 5/2002 Nagayama ........ G02F 1/133553
349/113

(Continued)

FOREIGN PATENT DOCUMENTS

CN 106169483 A 11/2016
CN 107402487 A 11/2017

(Continued)

OTHER PUBLICATIONS

Office Action for corresponding Chinese Application 201910918583.9 dated May 28, 2021.

(Continued)

*Primary Examiner* — Sang V Nguyen
(74) *Attorney, Agent, or Firm* — ArentFox Schiff LLP; Michael Fainberg

(57) ABSTRACT

The present disclosure relates to an array substrate, a liquid crystal display panel and a display device. The array substrate includes a base substrate on which a gate metal layer and a source-drain metal layer are stacked in sequence. The gate metal layer includes a plurality of independent gate lines and a plurality of independent dummy gates, the (Continued)

source-drain metal layer includes a plurality of independent data lines and a plurality of independent dummy drains. The dummy gate includes a main body portion in a pixel region defined by a gate line and a data line and a lead-out portion; and the dummy drains are in pixel regions, and the dummy drain in the pixel region includes a first subsection overlapping with the main body portion and a second subsection not overlapping with the main body portion.

20 Claims, 7 Drawing Sheets

(52) U.S. Cl.
CPC ...... *G02F 1/136286* (2013.01); *H01L 27/124* (2013.01); *H01L 27/1248* (2013.01); *H01L 27/1255* (2013.01)

(56) References Cited

U.S. PATENT DOCUMENTS

| | | | |
|---|---|---|---|
| 2007/0057260 A1* | 3/2007 | Lee | H01L 27/1248 257/72 |
| 2007/0058096 A1 | 3/2007 | Tsai et al. | |
| 2007/0139591 A1* | 6/2007 | Kim | G02F 1/133555 349/114 |
| 2008/0192163 A1 | 8/2008 | Lee et al. | |
| 2009/0206339 A1* | 8/2009 | Park | G02F 1/136213 257/E27.06 |
| 2013/0264595 A1 | 10/2013 | Hong et al. | |
| 2017/0068129 A1* | 3/2017 | Mochizuki | G02F 1/133553 |
| 2018/0145089 A1 | 5/2018 | Yu et al. | |
| 2021/0223641 A1 | 7/2021 | Bai et al. | |

FOREIGN PATENT DOCUMENTS

| | | |
|---|---|---|
| CN | 108072991 A | 5/2018 |
| CN | 109166516 A | 1/2019 |
| CN | 109270726 A | 1/2019 |
| CN | 208367390 U | 1/2019 |
| CN | 110571228 A | 12/2019 |

OTHER PUBLICATIONS

EESR for corresponding European Application 20868014.0 dated Oct. 5, 2022.

* cited by examiner

ARRAY SUBSTRATE, LIQUID CRYSTAL DISPLAY PANEL AND DISPLAY DEVICE

CROSSING REFERENCES TO RELATED APPLICATIONS

This application is a national phase entry under 35 U.S.C. § 371 of International Application No. PCT/CN2020/116497, filed on Sep. 21, 2020, claims the priority of Chinese Patent Application No. 201910918583.9 filed with the China National Intellectual Property Administration on Sep. 26, 2019, the entire contents of which are incorporated herein by reference.

FIELD

This disclosure relates to the technical field of display, and in particular to an array substrate, a liquid crystal display panel and a display device.

BACKGROUND

Reflectivity and power consumption are important indicators for measuring performance of reflective liquid crystal display panel products. In order to improve reflectivity of a total reflective LCD, a reflective liquid crystal display panel in the related art is provided with a resin layer with a concave-convex (bump) structure in a reflective layer of a TFT, some film layers below the resin layer contain metal, and some film layers below the resin layer do not contain metal. Metal has a light-reflecting effect, resulting in different morphology and slope angles of the concave-convex structure of the same pixel in different positions, thereby causing poor reflectivity and ununiform brightness display. Power consumption of a display is directly proportional to a display frequency, and thus the reflective liquid crystal display panel in the related art generally reduces display drive frequency, e.g., a low drive frequency of 1 Hz is used, in order to reduce the power consumption of the product. However, after the display drive frequency is reduced, retention time of a pixel voltage increases, the pixel voltage is continuously reduced due to an existence of leakage current, and a display screen is prone to flicker, which affects display effects.

SUMMARY

According to one aspect of the present disclosure, an array substrate is provided, which includes a base substrate, and a gate metal layer and a source-drain metal layer stacked in sequence on the base substrate.

The gate metal layer includes a plurality of gate lines that are independent of each other and a plurality of dummy gates that are independent of each other.

The source-drain metal layer includes a plurality of data lines that are independent of each other and a plurality of dummy drains that are independent of each other.

The dummy gate includes: a main body portion in a pixel region defined by a gate line and a data line, and a lead-out portion.

The dummy drains are in pixel regions, and the dummy drain in the pixel region includes a first subsection overlapping with the main body portion and a second subsection not overlapping with the main body portion.

In some embodiments, the array substrate further includes a gate insulating layer between the gate metal layer and the source-drain metal layer, and a plurality of reflective pixel electrodes on a side, facing away from the base substrate, of the source-drain metal layer.

A distance x between each of the dummy drains with any of the gate line and the data line defining the pixel region where the each dummy drain is located satisfies the following formula:

$$x \geq \frac{\pi * \left[\left(\frac{\pi C_{st}}{2000\varepsilon L^2} - 1\right) - L\right]}{d}$$

Cst is a storage capacitance of the reflective pixel electrodes, ε is a dielectric constant of the gate insulating layer, d is a thickness of the gate insulating layer, and L is a width of the gate line or the data line.

In some embodiments, the storage capacitance is a sum of an opposite capacitance between the first subsection and the main body portion and a coupling capacitance between the second subsection and the main body portion.

In some embodiments, the source-drain metal layer further includes drains electrically connected with the reflective pixel electrodes via the dummy drains.

In some embodiments, the array substrate further includes a resin layer with a concave-convex structure.

The resin layer is between a layer where the reflective pixel electrodes are located and the source-drain metal layer.

The reflective pixel electrodes are provided with a concave-convex structure same as the concave-convex of the resin layer.

In some embodiments, the slope angle of the concave-convex structure is 5° to 15°.

In some embodiments, the lead-out portion extends along an extending direction of the gate line, and is in contact with an edge portion of a side, away from the gate line, of the main body portion.

In some embodiments, the array substrate further includes an insulating layer between the resin layer and the layer where the reflective pixel electrodes are located.

The insulating layer is provided with a concave-convex same as the concave-convex structure of the resin layer.

In some embodiments, the gate metal layer further includes a gate(s) that has a double gate structure.

According to another aspect of the present disclosure, a liquid crystal display panel is provided, which includes an array substrate and an opposite substrate that are opposite to each other; and the array substrate is the above-mentioned array substrate.

In some embodiments, the liquid crystal display panel includes a common electrode located on the opposite substrate or the array substrate. The dummy gates and the common electrode are loaded with the same electrical signal.

According to another aspect of the present disclosure, a display device is provided, which includes the above-mentioned liquid crystal display panel.

DETAILED DESCRIPTION OF THE EMBODIMENTS

Figure 1:
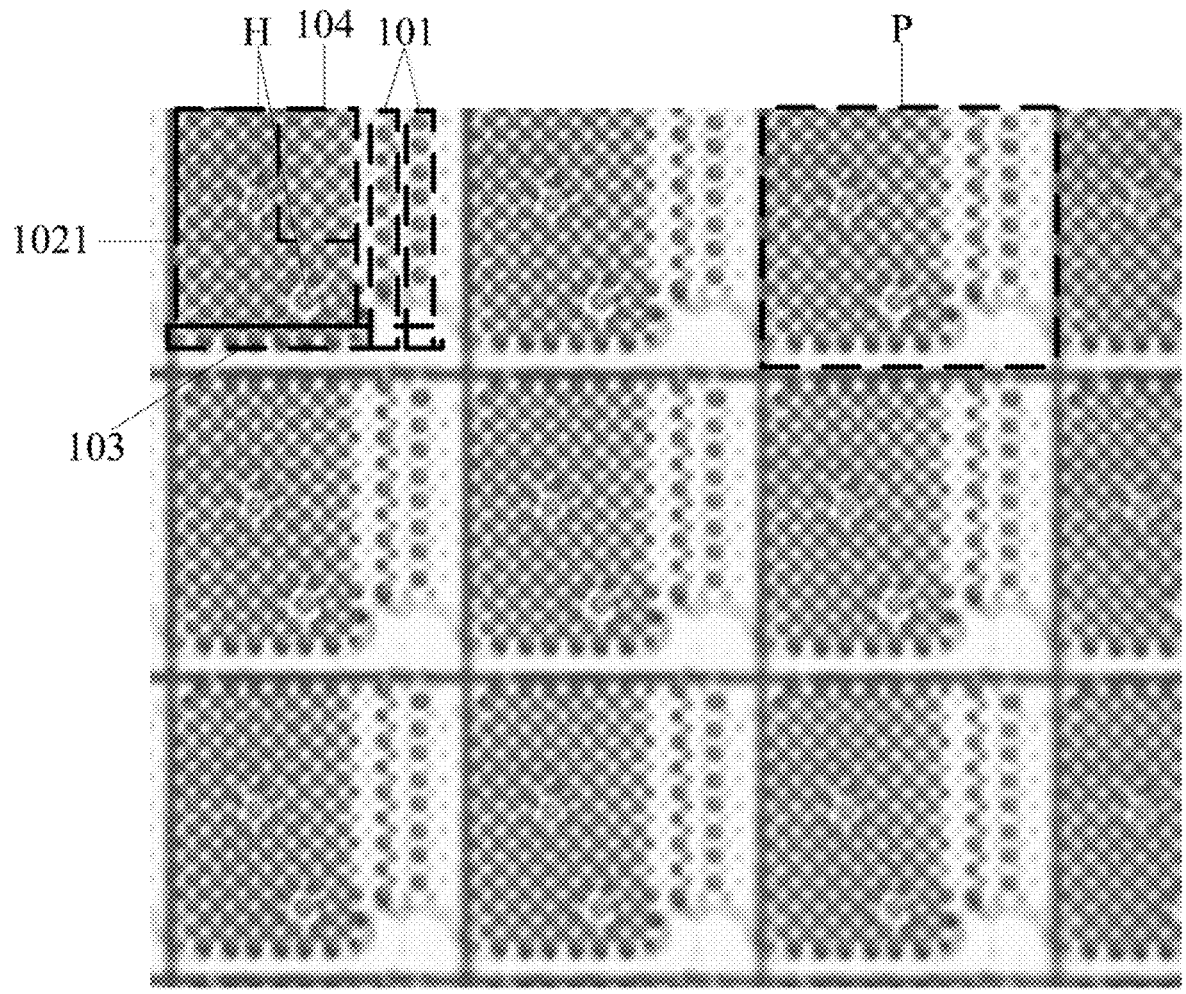
FIG. 1 is a microscope view of an array substrate according to an embodiment of the present disclosure.

In order to make the objectives, technical solutions, and advantages of the embodiments of the present disclosure clearer, the technical solutions of the embodiments of the present disclosure will be described clearly and comprehensively with reference to the accompanying drawings of the embodiments of the present disclosure. Obviously, the described embodiments are part of the embodiments of the present disclosure rather than all of them. Based on the described embodiments of the present disclosure, all the other embodiments obtained by those skilled in the art without creative labor fall within the protection scope of the present disclosure.

Unless otherwise defined, the technical terms or scientific terms used herein should have common meanings understood by those skilled in the field to which the present disclosure belongs. The expressions "first", "second" and similar expressions used in the description and claims of the present disclosure do not indicate any sequence, quantity or importance, but are only used to distinguish different components. The expressions "include" or "contain" and other similar expressions intend to indicate that elements or items preceding the expressions cover elements or items and their equivalents listed following the expressions, but do not exclude other elements or items. The expressions "inner", "outer", "upper", "lower" and the like are only used to indicate relative position relationships. When an absolute position of the described object changes, the relative positional relationship may also change accordingly.

The specific implementations of an array substrate, a liquid crystal display panel and a display device provided by embodiments of the present disclosure will be described in detail below with reference to the accompanying drawings. The thickness and shapes of film layers in the drawings do not reflect true ratios, but only serve to illustrate the present disclosure schematically.

Figure 2:
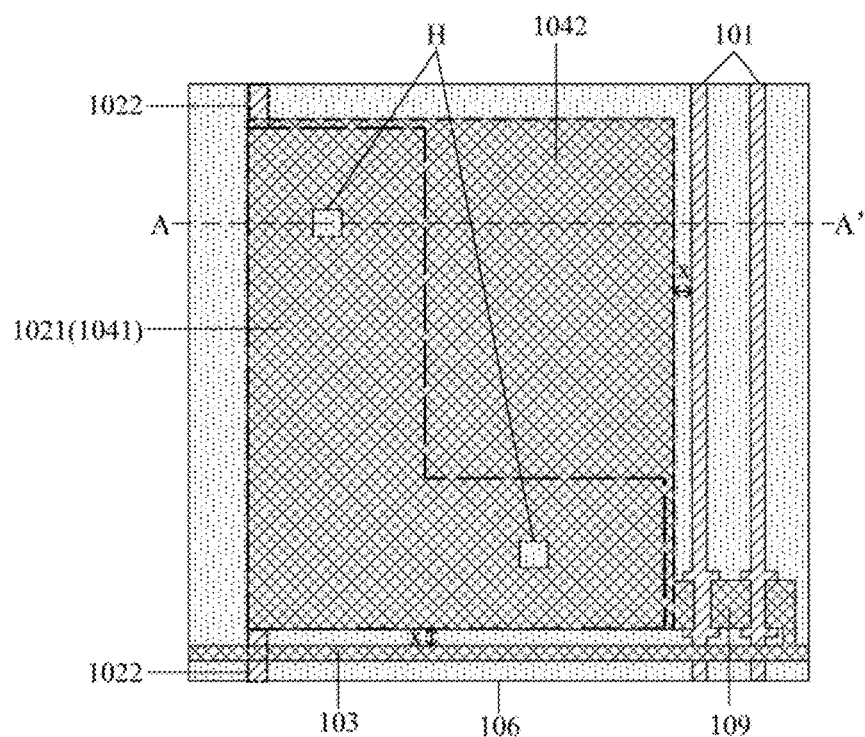
FIG. 2 is a schematic top view of one pixel structure in an array substrate according to an embodiment of the present disclosure.
Figure 3:
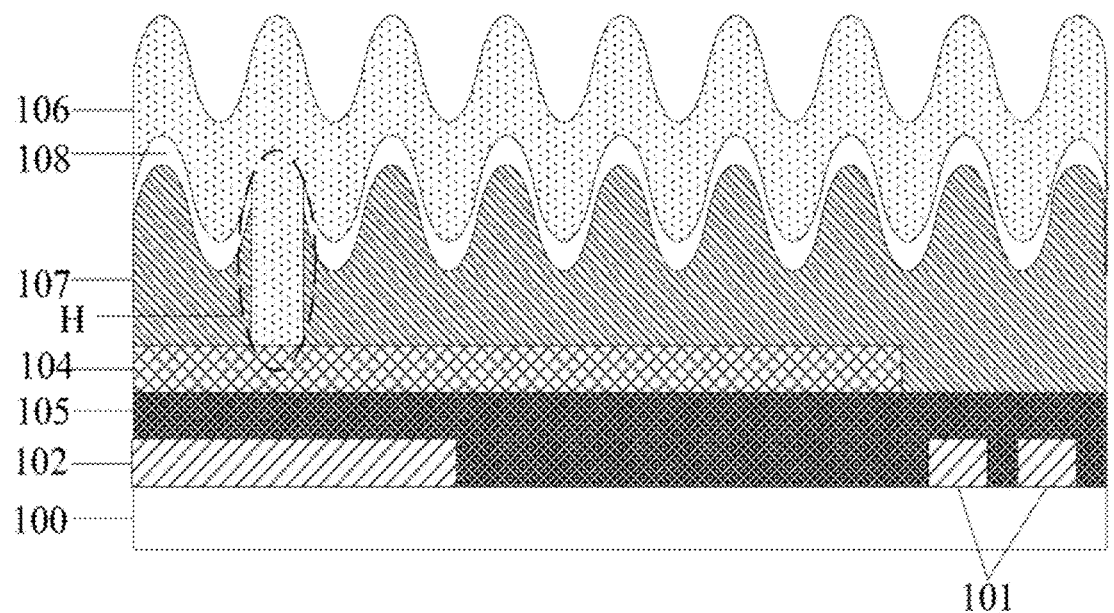
FIG. 3 is a schematic diagram of a cross-sectional structure along the line AA' in FIG. 2.

An array substrate provided by embodiments of the present disclosure, as shown in FIG. 1, includes a plurality of pixel structures P, and each of the pixel structures P is as specifically shown in FIG. 2 and FIG. 3. The array substrate includes a base substrate 100, and a gate metal layer and a source-drain metal layer stacked in sequence on the base substrate 100.

The gate metal layer includes a plurality of gate lines 101 and a plurality of dummy gates 102 that are independent of each other.

The source-drain metal layer includes a plurality of data lines 103 and a plurality of dummy drains 104 that are independent of each other.

The dummy gate 102 includes a main body portion 1021 in a pixel region defined by the gate line 101 and the data line 103, and a lead-out part 1022 in an extending direction of the gate line 101. The lead-out part 1022 is in contact with an edge portion of a side, away from the gate line, of the main body portion 1021.

The dummy drain 104 is located in the pixel region, and includes a first subsection 1041 overlapping with the main body portion 1021 and a second subsection 1042 not overlapping with the main body portion 1021.

In the above-mentioned array substrate provided by the embodiments of the present disclosure, the dummy drain 104 is provided with the first subsection 1041 overlapping with the main body portion 1021 of the dummy gate 102 and the second subsection 1042 not overlapping with the main body portion 1021 of the dummy gate 102, so that an opposite capacitance between the first subsection 1041 and the main body portion 1021 and a coupling capacitance between the second subsection 1042 and the main body portion 1021 together constitute a storage capacitance of pixel electrodes, which makes the storage capacitance of the pixel electrodes larger, effectively reduces influence of leakage current, improves flicker degree of images and improves display quality of the images.

Optionally, in the above-mentioned array substrate provided by the embodiments of the present disclosure, in order to ensure the dummy drain 104 to be maximally filled in the pixel region and to ensure a voltage change on the gate line 101 and the data line 103 not to impose an adverse pulling effect on a pixel voltage, it is necessary to ensure there is no opposite capacitance between the dummy drain 104 and any of the gate line 101, the data line 103, and transistor(s) in the pixel structure, and to ensure that any of the coupling capacitances generated respectively between the dummy drain 104 with the gate line 101 and the data line 103 is less than a certain value. In some embodiments, according to actual product experience, any of the coupling capacitances $C_0$ generated respectively between the dummy drain 104 with the gate line 101 and the data line 103 is less than or equal to one-thousandth of the storage capacitance $C_{st}$ of the pixel electrodes, i.e., $C_0 \leq C_{st}/1000$. Besides, $C_0$ is determined according to a calculation formula of an edge effect of a parallel plate capacitor:

$$C_0 \approx \frac{2\varepsilon L^2}{\pi}\left[L*\left(\frac{\pi L}{dx}+1\right)+1\right]$$

$\varepsilon$ is a dielectric constant of a gate insulating layer 105, d is a thickness of the gate insulating layer 105, L is a width of the gate line 101 or the data line 103, and x is a distance between the dummy drain 104 and any of the gate line 101 or the data line 103.

It can be seen from the above analysis that, optionally, in order to avoid the pulling effect on the pixel electrodes by the voltage on the gate lines 101 and the data lines 103, and to ensure the dummy drain 104 to be filled maximally in the pixel region, the above-mentioned array substrate, as shown in FIGS. 2 and 3, further includes the gate insulating layer 105 located between the gate metal layer and the source-drain metal layer, and a plurality of reflective pixel electrodes 106 located on a side, facing away from the base substrate 100, of the source-drain metal layer.

A distance x between each of the dummy drains 104 with any of the gate line 101 and the data line 103 defining the pixel region where the each dummy drain 104 is located satisfies the following formula:

$$x \geq \frac{\pi * \left[\left(\frac{\pi C_{st}}{2000\varepsilon L^2} - 1\right) - L\right]}{d}$$

$C_{st}$ is a storage capacitance of the reflective pixel electrodes 106, $\varepsilon$ is the dielectric constant of the gate insulating layer 105, d is the thickness of the gate insulating layer 105, and L is the width of the gate line 101 or the data line 103.

It should be noted that, in the above-mentioned array substrate provided by the embodiments of the present disclosure, as shown in FIG. 2, the gate of the gate metal layer has a double-gate structure electrically connected with two gate lines 101, the gate line 101 which has the distance x from the dummy drain 104 specifically refers to the gate line 101 closer to the dummy drain 104.

In addition, it is worth noting that, in the above-mentioned array substrate provided by the embodiments of the present disclosure, the distance x between each of the dummy drains 104 and the gate line 101 defining the pixel region where the each dummy drain is located, and the distance x between the dummy drain 104 and the data line 103 defining the pixel region where the dummy drain 104 is located may be the same or different, which is not limited herein.

Specifically, in the above-mentioned array substrate provided by the embodiments of the present disclosure, the storage capacitance $C_{st}$ of the reflective pixel electrodes 106 is a sum of the opposite capacitance $C_{st1}$ between the first subsection and the main body portion 1021, and the coupling capacitance $C_{st2}$ between the second subsection and the main body portion 1021.

Optionally, in the above-mentioned array substrate provided by the embodiments of the present disclosure, the source-drain metal layer further includes drains 109 electrically connected with the reflective pixel electrodes 106 via the dummy drains 104. In some embodiments, the dummy drains 104 and the reflective pixel electrodes 106 are electrically connected through via holes H, as shown in FIGS. 2 and 3.

Figure 4:
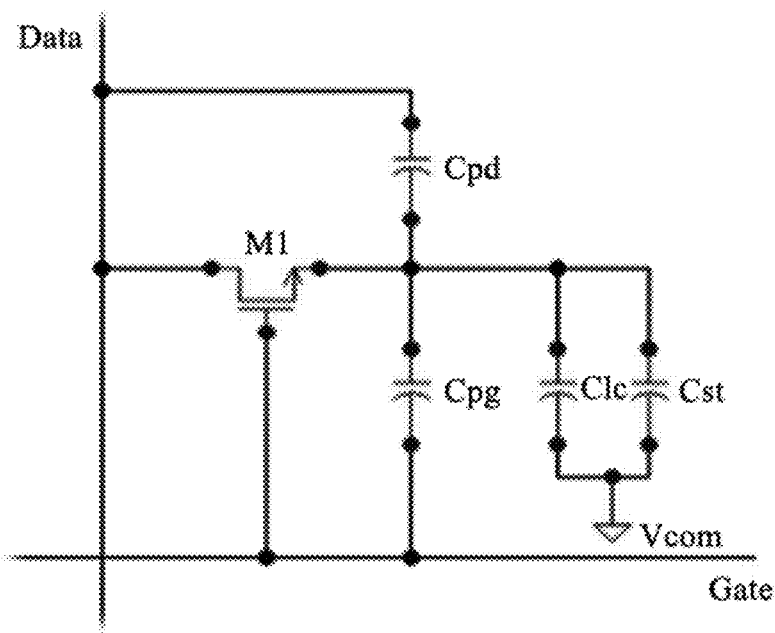
FIG. 4 is a schematic diagram of an equivalent circuit of the pixel structure shown in FIG. 2.

FIG. 4 shows an equivalent circuit diagram of one pixel structure in the above-mentioned array substrate provided by the embodiments of the present disclosure. According to the equivalent circuit diagram, a pixel voltage change $\Delta V_{pd}$ caused by the voltage change of the data line 103 may be expressed by the following formula:

$$\Delta V_{pd} = \frac{C_{pd}}{C_{st} + C_{lc} + C_{pg} + C_{pd}}(V_{dh} - V_{dl})$$

$C_{pd}$ represents a capacitance between the reflective pixel electrodes 106 and the data line 103, and $C_{st}$ represents a storage capacitance of the reflective pixel electrodes 106 (i.e., a sum of the opposite capacitance $C_{st}$ between the first subsection and the main body portion 1021 and the coupling capacitance $C_{st2}$ between the second subsection and the main body portion 1021), $C_{pg}$ represents a capacitance between the reflective pixel electrodes 106 and the gate line 101, $C_{lc}$ represents a capacitance between the reflective pixel electrodes 106 and liquid crystal molecules, and $V_{dh}$-$V_{dl}$ represents a voltage change amount of the data line 103. It can be seen from the above formula that when the storage capacitance $C_{st}$ of the reflective pixel electrodes 106 increases, the pixel voltage amount change $\Delta V_{pd}$ caused by the voltage change of the data line 103 decreases. In other words, the voltage change of the data line 103 decreases as the storage capacitance $C_{st}$ of the reflective pixel electrodes 106 increases. Therefore, the technical solution provided by the present disclosure can effectively prevent flicker, improve display quality of images, and is low in power consumption.

In related techniques, a reflective liquid crystal display panel has problems such as low reflectivity and strong dependence on external light sources, and reflectivity is an important indicator to measure performance of reflective products. Optionally, in order to improve reflectivity, the above-mentioned array substrate provided by the embodiments of the present disclosure, as shown in FIG. 3, may further include a resin layer 107 with a concave-convex structure (bump).

The resin layer 107 is located between the layer where the reflective pixel electrodes 106 are located and the source-drain metal layer.

The reflective pixel electrodes 106 are provided with the same concave-convex structure as that of the resin layer 107.

By setting the resin layer 107 to have a concave-convex structure, and the reflective pixel electrodes 106 and the resin layer 107 have the same concave-convex structure, so that incident light can be diffusely reflected on the reflective pixel electrodes 106 with the concave-convex structure, thereby improving reflectivity to further improve brightness and contrast.

Figure 5:
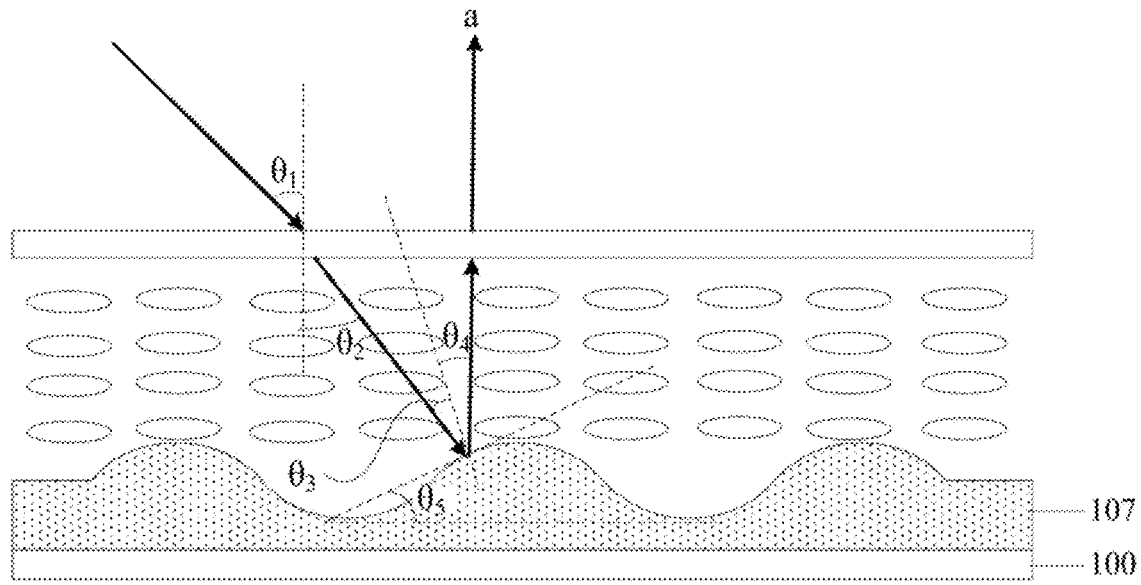
FIG. 5 is a design principle diagram of a resin layer according to an embodiment of the present disclosure.

At present, evaluation methods of the reflective liquid crystal display panels are mainly to evaluate the reflectivity and contrast at a main viewing angle (i.e., the viewing angle range that has an included angle of ±5° with the 'a' direction) adopting light incident on the reflective liquid crystal display panels at an angle of 30°, as shown in FIG. 5.

According to the law of refraction:

$$\frac{\sin \theta_1}{\sin \theta_2} = \frac{n_{cell}}{n_{air}}$$

θ1 represents an incident angle of light, which is 30°; θ2 represents a refraction angle of light in the liquid crystal display panels; $n_{cell}$ represents a refractive index of the liquid crystal display panel, which is about 1.5; and $n_{air}$ represents a refractive index of air, which is 1. Accordingly it can be obtained that the refraction angle θ2 is arcsin(⅓).

Besides, according to the law of reflection:

$$\theta_3 = \theta_4 = \theta_5 = \frac{\theta_2}{2} \approx 10°(\pm 5°)$$

θ3 represents an incident angle of light on the concave-convex structure, θ4 represents a reflection angle of light on the concave-convex structure, and θ5 represents a slope angle of light on the concave-convex structure. In this text, the slope angle of the concave-convex structure is defined as an included angle between a tangent line of the slope surface at half of a vertical distance between the lowest point and the highest point of the concave-convex structure and a horizontal line.

Based on this, in the above-mentioned array substrate provided by the embodiments of the present disclosure, the slope angle of the concave-convex structure can be set to be 5° to 15°, thereby increasing brightness of the main viewing angle and expanding the viewing angle range.

Figure 6:
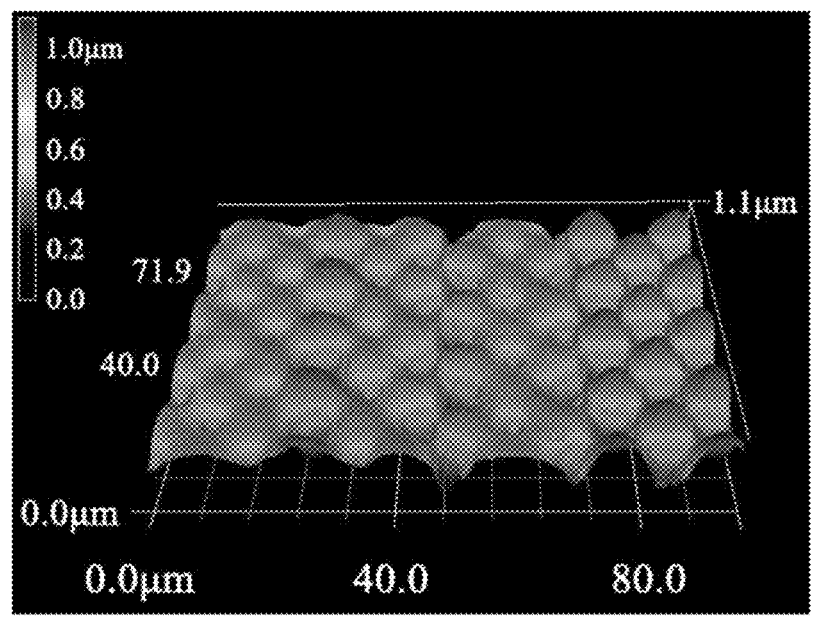
FIG. 6 is a 3D effect diagram of a resin layer according to an embodiment of the present disclosure.

Specifically, the resin layer 107 with a concave-convex structure can be produced with the following method: one layer of resin with a certain thickness is coated on the array substrate by a spin coating method, then a light shield with a bump pattern is placed above the resin, and after exposure, development and annealing treatments, the resin layer 107 with a concave-convex structure is formed. Moreover, in the actual manufacturing process, due to configuration of the first subsection and second subsection included in the dummy drains 104, uniformity of the film layers below the resin layer 107 in the entire pixel region is better (i.e., the metal film layer of the dummy drains 104 exists below most parts of the resin layer 107), and thus in the actual exposure process, the actual exposure amounts irradiated on the resin layer 107 in the pixel display region are substantially the same, and the concave-convex structure of the resin layer 107 has more uniform morphology (as shown in FIG. 6), so that reflectivity of the reflective pixel electrodes 106 with the same concave-convex structure is better, display brightness and contrast of the liquid crystal display panels are improved, and the display quality of the images is better.

Optionally, the above-mentioned array substrate provided by the embodiments of the present disclosure, as shown in FIG. 3, further includes an insulating layer 108 located between the resin layer 107 and the layer where the reflective pixel electrodes 106 are located.

The insulating layer 108 has the same concave-convex structure as that of the resin layer 107.

Based on the same inventive concept, the embodiments of the present disclosure further provide a liquid crystal display panel, which includes an array substrate and an opposite substrate that are opposite to each other. The array substrate is the above-mentioned array substrate provided by the embodiments of the present disclosure. Since the principle of solving the problem by the liquid crystal display panel is similar to the principle of solving the problem by the above-mentioned array substrate, the embodiments of the above-mentioned array substrate may be referred to for implementation of the liquid crystal display panel, and repetitions will be omitted herein.

Optionally, in order to form the storage capacitance $C_{st}$ of the reflective pixel electrodes 106 between the dummy gates 102 and the dummy drains 104, the above-mentioned liquid crystal display panel provided by the embodiments of the present disclosure further includes a common electrode located on the opposite substrate or the array substrate.

The dummy gates 102 and the common electrode are loaded with the same electrical signal.

In the above-mentioned array substrate provided by the embodiments of the present disclosure, common voltage ($V_{com}$) signal is loaded on the dummy gates 102 (Dummy Gate), and pixel voltage (Pixel) signal is loaded on the dummy drains 104 (Dummy SD), so that the storage capacitance $C_{st}$ of the reflective pixel electrodes 106 is formed between the dummy gates 102 and the dummy drains 104.

In order to better illustrate the technical solution of the embodiments of the present disclosure, a set of comparative embodiments will be used for illustrations below.

Figure 7:
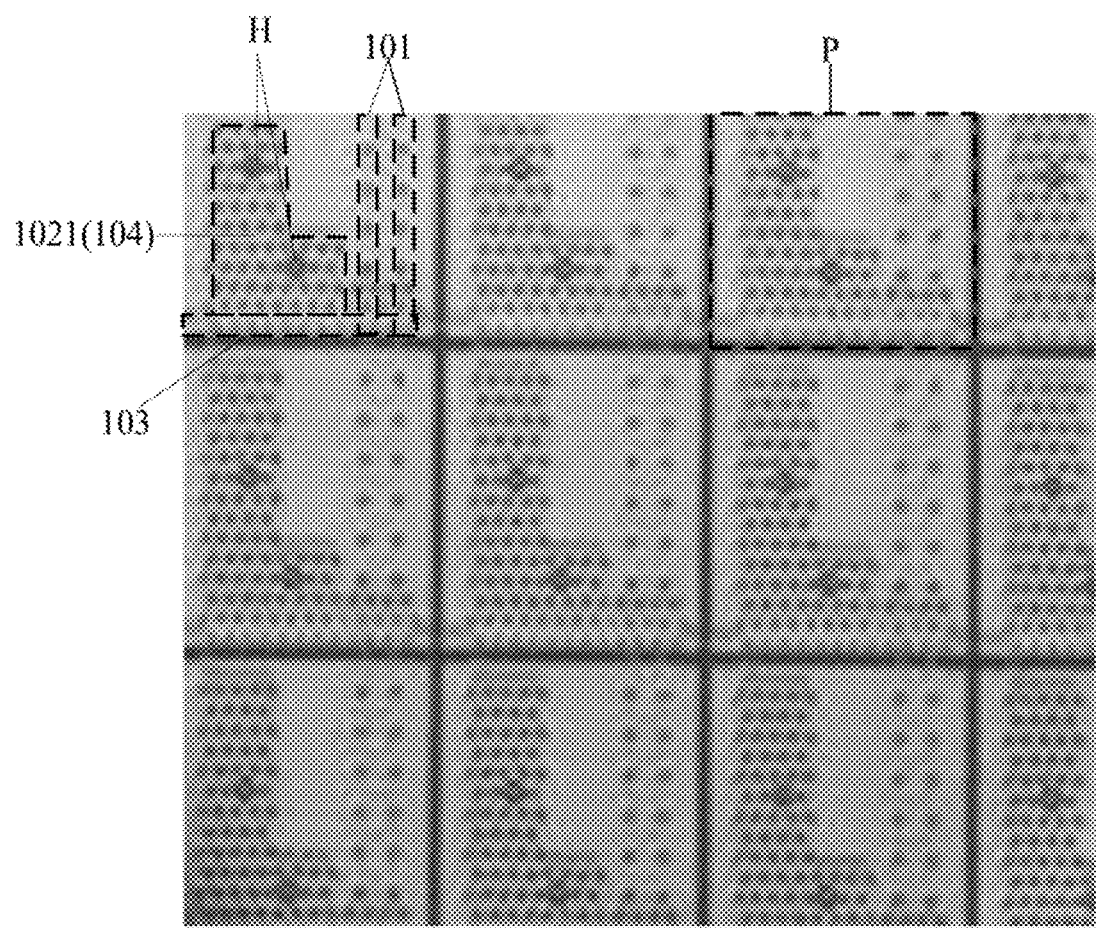
FIG. 7 is a microscope view of an array substrate according to a comparative embodiment.
Figure 8:
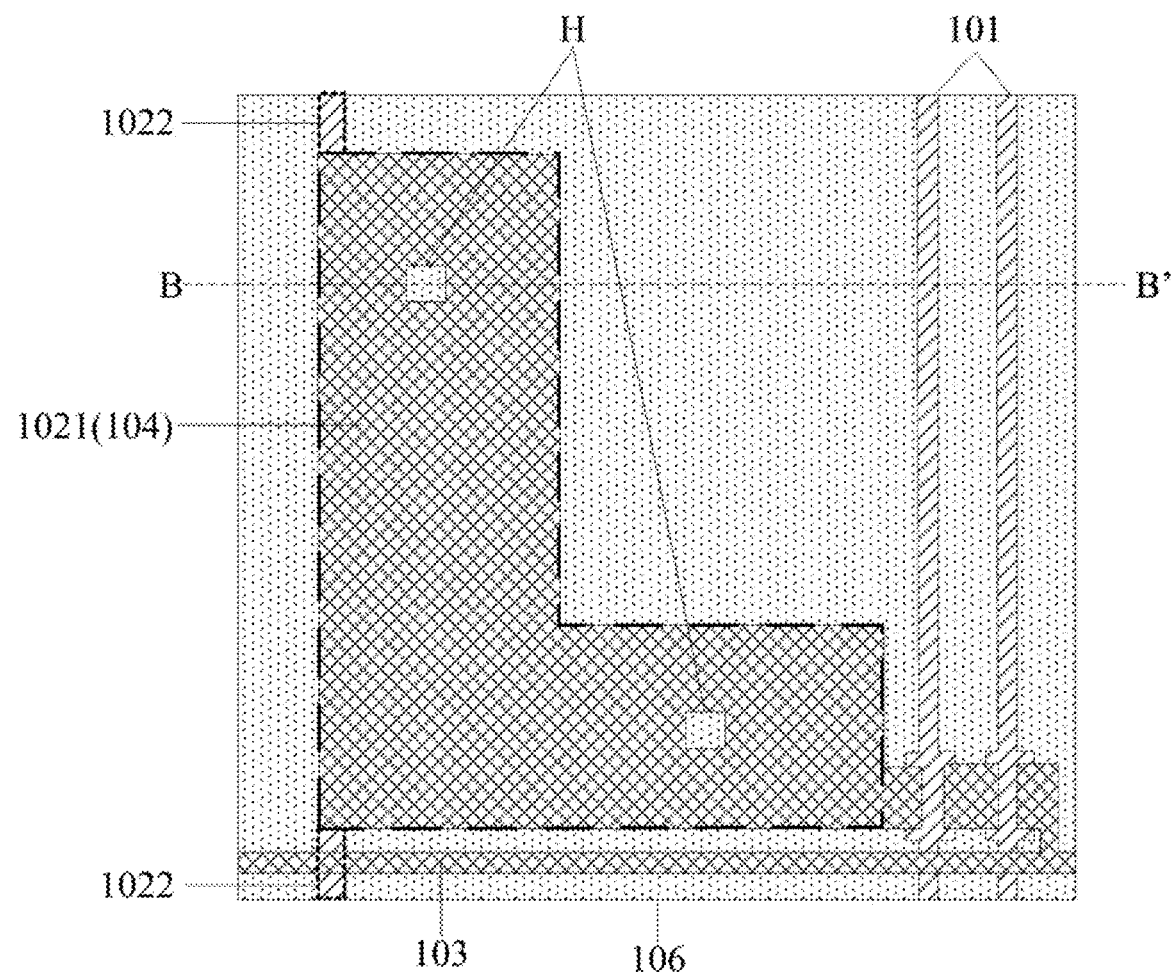
FIG. 8 is a schematic top view of one pixel structure in an array substrate according to a comparative embodiment.
Figure 9:
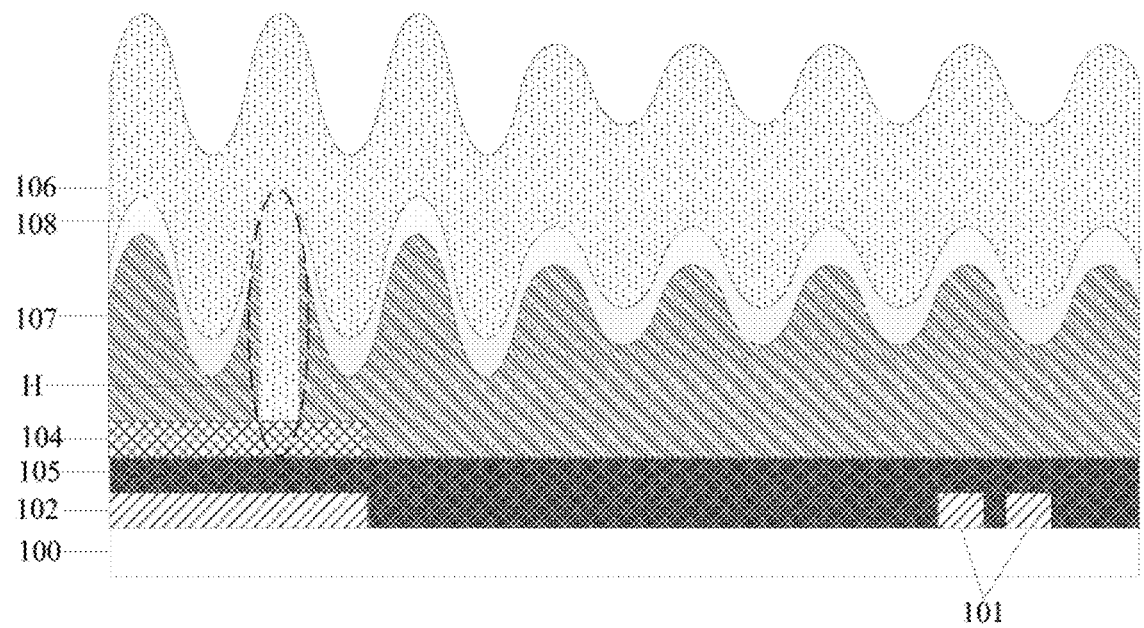
FIG. 9 is a schematic diagram of a cross-sectional structure along the line BB' in FIG. 8.
Figure 10:
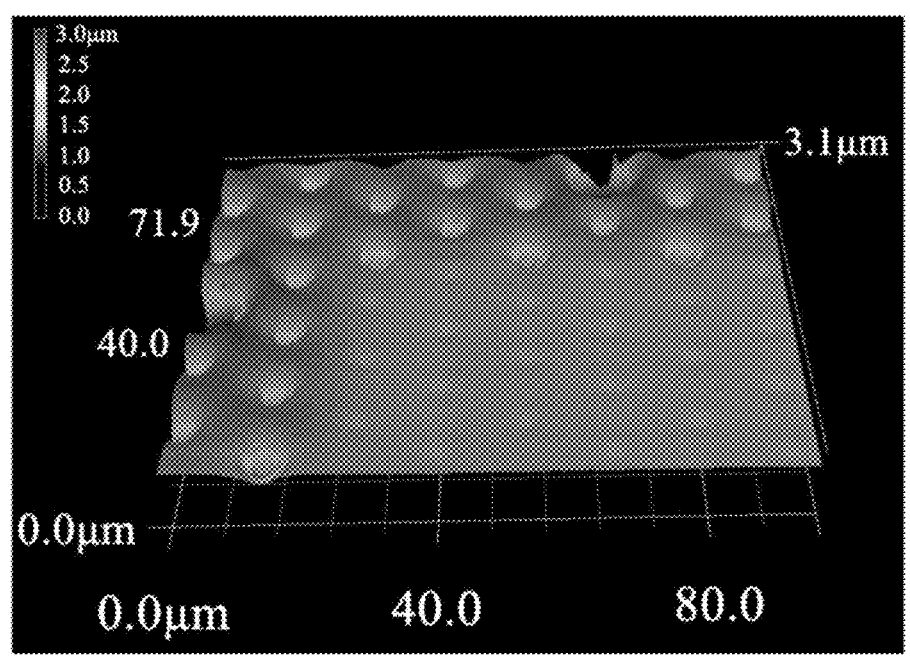
FIG. 10 is a 3D effect diagram of a resin layer according to a comparative embodiment.

Specifically, the liquid crystal display panel provided by the embodiments of the present disclosure includes the array substrate shown in FIG. 1, one pixel structure on the array substrate is shown in FIGS. 2 and 3, and morphology of the resin layer on the array substrate is shown in FIG. 6. The liquid crystal display panel provided by the comparative embodiments includes the array substrate shown in FIG. 7, one pixel structure on the array substrate is shown in FIGS. 8 and 9, and morphology of the resin layer on the array substrate is shown in FIG. 10.

Through comparison of FIG. 1 and FIG. 7, FIG. 2 and FIG. 8, FIG. 3 and FIG. 9, and FIG. 6 and FIG. 10 respectively, it can be found that the array substrate provided by the embodiments of the present disclosure is different from the array substrate provided by the comparative embodiments in that in the array substrate provided by the embodiments of the present disclosure, the dummy drain 104 includes the first subsection 1041 overlapping with the main body portion 1021 of the dummy gate 102 and the second subsection 1042 not overlapping with the main body portion 1021 of the dummy gates 102. Moreover, morphology of the concave-convex structure in the resin layer 107 is more uniform and dense. In the array substrate provided by the comparative embodiments, the dummy drain 104 and the main body portion 1021 of the dummy gate 102 overlap with each other; the concave-convex structure in the resin layer 107 above the dummy drain 104 has a deeper morphology, and the concave-convex structure in the resin layer 107 in other regions has a relatively shallow morphology; and density of the concave-convex structure in the resin layer 107 is relatively small.

Correspondingly, in the present application, reflectivity of the array substrates in the set of embodiments is further tested, and the results are shown in Table 1. DP in Table 1 represents a side where a Pad terminal having an IC chip and a flexible circuit board (FPC) is located, DO represents a side opposite to the side where the Pad terminal is located, L represents the left side of the side where the Pad terminal is located, and R represents the right side of the side where the Pad terminal is located.

It can be seen from Table 1 that reflectivity of the liquid crystal display panel provided by embodiments of the present disclosure at different angles is better than relevant data of the comparative embodiments. Therefore, the liquid crystal display panel provided by the embodiments of the present disclosure has better optical performance as well as high reflectivity and display uniformity.

TABLE 1

| Tested Items | | Comparative Embodiments | Embodiments of the present disclosure |
|---|---|---|---|
| Reflectivity | DP | 12% | 26% |
| | DO | 11% | 27% |
| | L | 13% | 30% |
| | R | 12% | 27% |

Based on the same inventive concept, the embodiments of the present disclosure further provide a display device, which includes the above-mentioned liquid crystal display panel provided by the embodiments of the present disclosure. The display device may be a mobile phone, a tablet computer, a television, a display, a notebook computer, a digital photo frame, a navigator, a smart watch, a fitness wristband, a personal digital assistant and any other product or component with display functions. Since the principle of solving the problem by the display device is similar to the principle of solving the problem by the above-mentioned liquid crystal display panel, the embodiments of the above-mentioned liquid crystal display panel may be referred to for implementation of the display device, and repetitions will be omitted herein.

The array substrate, the liquid crystal display panel and the display device provided by the embodiments of the present disclosure include a base substrate on which a gate metal layer and a source-drain metal layer are stacked in sequence. The gate metal layer includes a plurality of gate lines and a plurality of dummy gates that are independent of each other, the source-drain metal layer includes a plurality of data lines and a plurality of drains that are independent of each other. The dummy gate includes a main body portion in a pixel region defined by the gate line and the data line, and a lead-out portion in the extending direction of the gate line. The lead-out portion is in contact with an edge portion of one side, away from the gate line, of the main body portion. The dummy drains are located in the pixel regions and the dummy drain in the pixel region includes a first subsection overlapping with the main body portion and a second subsection not overlapping with the main body portion. By configuring the dummy drain to have the first subsection overlapping with the main body portion of the dummy gate and the second subsection not overlapping with the main body portion of the dummy gate, the opposite capacitance between the first subsection and the main body portion and the coupling capacitance between the second subsection and the main body portion together constitute the storage capacitance of the pixel electrodes, which makes the storage capacitance of the pixel electrodes larger, effectively reduces influence of leakage current, improves flicker of images, and improves display quality of images. In addition, due to the setting mode of the dummy drains, the actual exposure amounts irradiated on the resin layer in the pixel display region are substantially the same in the actual exposure process, and a better uniformity of morphology of the concave-convex structure of the resin layer is achieved, so that the reflective pixel electrodes with the same concave-convex structure have a higher reflectivity, the display brightness and contrast of the liquid crystal display panel are thus improved, and display quality of the images are better.

Obviously, those skilled in the art can make various changes and modifications to the present disclosure without departing from the spirits and scopes of the present disclosure. In this way, if these modifications and variations of the present disclosure fall within the scope of the claims of the present disclosure and equivalent technologies, the present disclosure also intends to cover these modifications and variations.

What is claimed is:

1. An array substrate, comprising:
a base substrate; and
a gate metal layer and a source-drain metal layer stacked in sequence on the base substrate;
wherein:
the gate metal layer comprises:
a plurality of gate lines that are independent of each other; and
a plurality of dummy gates that are independent of each other;
the source-drain metal layer comprises:
a plurality of data lines that are independent of each other; and
a plurality of dummy drains that are independent of each other;
wherein:
the dummy gate comprises:
a main body portion in a pixel region defined by a gate line and a data line, wherein an orthographic projection of the main body portion on the base substrate is in an "L" shape; and
a lead-out portion; and
the dummy drains are in pixel regions, and the dummy drain in the pixel region comprises:
a first subsection overlapping with the main body portion; and
a second subsection not overlapping with the main body portion, wherein an opposite capacitance is between the first subsection and the main body portion and a coupling capacitance is between the second subsection and the main body portion; the second subsection surrounds the first subsection by half; and an orthographic projection of the first subsection on the base substrate is in an "L" shape, and an orthographic projection of the second subsection on the base substrate and the orthographic projection of the first subsection on the base substrate complement each other to form a rectangle.

2. The array substrate according to claim 1, further comprising:
a gate insulating layer between the gate metal layer and the source-drain metal layer; and
a plurality of reflective pixel electrodes on a side, facing away from the base substrate, of the source-drain metal layer;
wherein a distance x between each of the dummy drains and any of gate line and data line defining a pixel region where the each dummy drain is located satisfies following formula:

$$x \geq \frac{\pi * \left[\left(\frac{\pi C_{st}}{2000 \varepsilon L^2} - 1\right) - L\right]}{d}$$

wherein Cst is a storage capacitance of the reflective pixel electrodes, ε is a dielectric constant of the gate insulating layer, d is a thickness of the gate insulating layer, and L is a width of the gate line or data line.

3. The array substrate according to claim 2, wherein the storage capacitance is a sum of the opposite capacitance between the first subsection and the main body portion and the coupling capacitance between the second subsection and the main body portion.

4. The array substrate according to claim 2, wherein the source-drain metal layer further comprises drains electrically connected with the reflective pixel electrodes via the dummy drains.

5. The array substrate according to claim 2, further comprising:
a resin layer with a concave-convex structure;
wherein, the resin layer is between a layer where the reflective pixel electrodes are located and the source-drain metal layer; and
the reflective pixel electrodes are provided with a concave-convex structure same as the concave-convex structure of the resin layer.

6. The array substrate according to claim 5, wherein a slope angle of the concave-convex structure is 5° to 15°.

7. The array substrate according to claim 1, wherein the lead-out portion extends in an extending direction of the gate line and is in contact with an edge portion of a side, away from the gate line, of the main body portion.

8. The array substrate according to claim 5, further comprising:
an insulating layer between the resin layer and the layer where the reflective pixel electrodes are located;

wherein the insulating layer is provided with a concave-convex structure same as the concave-convex structure of the resin layer.

9. The array substrate according to claim 1, wherein the gate metal layer further comprises a gate that has a double-gate structure.

10. A liquid crystal display panel, comprising:
an array substrate; and
an opposite substrate arranged in opposite to the array substrate;
wherein the array substrate comprises:
a base substrate; and
a gate metal layer and a source-drain metal layer stacked in sequence on the base substrate;
wherein:
the gate metal layer comprises:
a plurality of gate lines that are independent of each other; and
a plurality of dummy gates that are independent of each other;
the source-drain metal layer comprises:
a plurality of data lines that are independent of each other; and
a plurality of dummy drains that are independent of each other;
wherein:
the dummy gate comprises:
a main body portion in a pixel region defined by a gate line and a data line, wherein an orthographic projection of the main body portion on the base substrate is in an "L" shape; and
a lead-out portion; and
the dummy drains are in pixel regions, and the dummy drain in the pixel region comprises:
a first subsection overlapping with the main body portion; and
a second subsection not overlapping with the main body portion, wherein an opposite capacitance is between the first subsection and the main body portion and a coupling capacitance is between the second subsection and the main body portion; the second subsection surrounds the first subsection by half; and an orthographic projection of the first subsection on the base substrate is in an "L" shape, and an orthographic projection of the second subsection on the base substrate and the orthographic projection of the first subsection on the base substrate complement each other to form a rectangle.

11. The liquid crystal display panel according to claim 10, further comprising:
a common electrode on the opposite substrate or the array substrate.

12. A display device, comprising a liquid crystal display panel, wherein the liquid crystal display panel comprises:
an array substrate; and
an opposite substrate arranged in opposite to the array substrate;
wherein the array substrate comprises:
a base substrate; and
a gate metal layer and a source-drain metal layer stacked in sequence on the base substrate;
wherein:
the gate metal layer comprises:
a plurality of gate lines that are independent of each other; and
a plurality of dummy gates that are independent of each other;
the source-drain metal layer comprises:
a plurality of data lines that are independent of each other; and
a plurality of dummy drains that are independent of each other;
wherein:
the dummy gate comprises:
a main body portion in a pixel region defined by a gate line and a data line, wherein an orthographic projection of the main body portion on the base substrate is in an "L" shape; and
a lead-out portion; and
the dummy drains are in pixel regions, and the dummy drain in the pixel region comprises:
a first subsection overlapping with the main body portion; and
a second subsection not overlapping with the main body portion, wherein an opposite capacitance is between the first subsection and the main body portion and a coupling capacitance is between the second subsection and the main body portion; the second subsection surrounds the first subsection by half; and an orthographic projection of the first subsection on the base substrate is in an "L" shape, and an orthographic projection of the second subsection on the base substrate and the orthographic projection of the first subsection on the base substrate complement each other to form a rectangle.

13. The liquid crystal display panel according to claim 10, wherein the array substrate further comprises:
a gate insulating layer between the gate metal layer and the source-drain metal layer; and
a plurality of reflective pixel electrodes on a side, facing away from the base substrate, of the source-drain metal layer;
wherein a distance x between each of the dummy drains and any of gate line and data line defining a pixel region where the each dummy drain is located satisfies following formula:

$$x \geq \frac{\pi * \left[\left(\frac{\pi C_{st}}{2000 \varepsilon L^2} - 1\right) - L\right]}{d}$$

wherein Cst is a storage capacitance of the reflective pixel electrodes, ε is a dielectric constant of the gate insulating layer, d is a thickness of the gate insulating layer, and L is a width of the gate line or data line.

14. The liquid crystal display panel according to claim 13, wherein the storage capacitance is a sum of the opposite capacitance between the first subsection and the main body portion and the coupling capacitance between the second subsection and the main body portion.

15. The liquid crystal display panel according to claim 13, wherein the source-drain metal layer further comprises drains electrically connected with the reflective pixel electrodes via the dummy drains.

16. The liquid crystal display panel according to claim 13, wherein the array substrate further comprises:
a resin layer with a concave-convex structure;
wherein, the resin layer is between a layer where the reflective pixel electrodes are located and the source-drain metal layer; and the reflective pixel electrodes are provided with a concave-convex structure same as the concave-convex structure of the resin layer.

17. The liquid crystal display panel according to claim 16, wherein a slope angle of the concave-convex structure is 5° to 15°.

18. The liquid crystal display panel according to claim 10, wherein the lead-out portion extends in an extending direction of the gate line and is in contact with an edge portion of a side, away from the gate line, of the main body portion.

19. The liquid crystal display panel according to claim 16, wherein the array substrate further comprises:
   an insulating layer between the resin layer and the layer where the reflective pixel electrodes are located;
   wherein the insulating layer is provided with a concave-convex structure same as the concave-convex structure of the resin layer.

20. The liquid crystal display panel according to claim 10, wherein the gate metal layer further comprises a gate that has a double-gate structure.

* * * * *